United States Patent [19]

Sasa

[11] 4,455,364

[45] Jun. 19, 1984

[54] PROCESS FOR FORMING METALLIC IMAGE, COMPOSITE MATERIAL FOR THE SAME

[75] Inventor: Nobumasa Sasa, Hino, Japan

[73] Assignee: Konishiroku Photo Industry Co., Ltd., Tokyo, Japan

[21] Appl. No.: 439,427

[22] Filed: Nov. 5, 1982

[30] Foreign Application Priority Data

Nov. 14, 1981 [JP] Japan ................................ 56-181747
Nov. 14, 1981 [JP] Japan ................................ 56-181748
Nov. 14, 1981 [JP] Japan ................................ 56-181749

[51] Int. Cl.$^3$ ...................... C23F 1/02; C03C 15/00; C03C 25/06; B44C 1/22
[52] U.S. Cl. .............................. 430/299; 156/659.1; 156/664; 156/665; 156/668; 252/79.4; 252/79.5; 430/433; 430/434; 430/323
[58] Field of Search ............ 156/656, 659.1, 664–666, 156/668; 252/79.1–79.5; 430/299, 300–310, 313, 401, 432, 318, 433, 434, 323, 439, 441; 427/43.1

[56] References Cited

U.S. PATENT DOCUMENTS 3,438,901 4/1969 Vassileff ......................... 252/79.4 X

FOREIGN PATENT DOCUMENTS 1383383 2/1975 United Kingdom ............... 252/79.5

Primary Examiner—William A. Powell
Attorney, Agent, or Firm—Frishauf, Holtz, Goodman & Woodward

[57] ABSTRACT

There is disclosed a process for forming a metallic image which comprises treating a composite material for forming a metallic image in the presence of a metal chelating agent. Also disclosed is a composite material for use in the process containing a support, a metallic thin layer and a light-sensitive resin layer, wherein a metal chelating agent is included in at least one layer on the support, and a treating solution for the same wherein the metal chelating agent is included therein.

According to the invention, it is possible to obtain a metallic image having highly sharp edges in the etched portions.

23 Claims, No Drawings

PROCESS FOR FORMING METALLIC IMAGE, COMPOSITE MATERIAL FOR THE SAME

This invention relates to a process for forming a metallic image, more particularly to a process for forming a metallic image by the use of a treating solution which contains a metal chelating agent and a composite material for forming a metallic image having a metallic thin layer disposed over a support and a light-sensitive resin layer or an image-wise etching resistant layer.

This invention relates further to a composite material for forming a metallic image and treating solution for the same, more particularly to a composite material which is able to permit the formation of a high contrast image and which is suitable for line work and half tone image.

In a composite material for forming a metallic image, there has generally been known that the material which carries a metallic thin layer (a deposit layer, a laminated foil layer or the like) has the disadvantage that the metallic thin layer is hard to etch by a weak etching solution and therefore cannot form a resist. Therefore, the etching stage will take a prolonged period of time, and thus it is required to use a strong etching solution and a resist having extremely high anticorrosion. Moreover, sharp images will be difficult to obtain and edges of formed images will be likely disarrayed. On the other hand, as a means of eliminating such a disadvantage, a deposit layer including together aluminum and an organic material capable of being deposited has been developed as disclosed in Japanese Provisional Patent Publication No. 9736/1981. In this technique, however, such a weak developing solution as will not attack a used resist is employed for the organic material. Therefore, it is still impossible to accomplish a shorth time etching treatment and such methods are not practical.

In Japanese Provisional Patent Publication Nos. 139720/1975 and 135641/1976, a mere aqueous alkaline solution is revealed as a treating solution for use in the development or the dot etching of a material for forming a metallic image in which an aluminum-deposit layer is disposed over a support and a light-sensitive resin layer is superimposed thereover. However, this technique has the drawback of slow etching speed, and involves the problem that images will be damaged by foam which will be produced violently at the time of etching, when the alkalinity of the etching solution is hightened to accelerate the etching speed.

Further, in Japanese Provisional Patent Publication No. 2925/1975, there is disclosed an etching solution for a material for forming a metallic image in which a layer including Te as a main component is disposed over a substrate, which etching solution is prepared by adding sodium perchlorate to an aqueous alkaline solution. However, this technique also has the problem that a satisfactory etching speed has not yet been obtained, though the speed is somewhat higher than in the case of a single aqueous alkaline solution.

Accordingly, an object of this invention is to provide a process for forming a metallic image capable of etching a metallic thin layer at high speed, more specifically, to provide a process for forming a metallic image by the use of a developing solution or a dot etching solution suitable for the developing treatment of a composite material for forming a metallic image in which the metallic thin layer is disposed over a support and a light-sensitive resin layer is further superimposed thereover.

Another object of this invention is to provide a composite material for forming a metallic image which permits a metallic thin layer to be etched in a short period of time without using any strong etching solution for achieving a prompt etching treatment of a metallic thin layer, and which permits the formation of clear-cut images.

The above-mentioned object of this invention can be achieved by providing a treating solution for use in a developing treatment or dot etching treatment of a composite material for forming a metallic image having a metallic thin layer over a support and a light-sensitive resin layer or an image-wise etching resistant layer, in which a metal chelating agent is included.

Further, the above object of this invention is accomplished by providing a composite material for forming a metallic image having a metallic thin layer over a support and a light-sensitive resin layer over the metallic thin layer, in which a metal chelating agent is included in at least one layer on the support.

Namely, there is provided a process for forming a metallic image comprising the step of treating a composite material for forming a metallic image which has a metallic thin layer over a support and a light-sensitive resin layer or an image-wise etching resistant layer over said metallic thin layer, in the presence of a metal chelating agent.

Now, this invention will be described in detail as follows:

The process for the formation of a metallic image on the composite material with regard to this invention can be carried out as follows: Exposure will be made on the material for forming the metallic image, with a mask having a desired image used as an original, in order to cause the formation of a latent image corresponding to the image on the light-sensitive resin layer of the material, and it will be subjected to a developing treatment to remove easily soluble portions of the resin layer by dissolution, or after the development, peelable portions on the layer will be removed therefrom by peeling. Next, the portions, not covered with the resist, of the metallic thin layer will be dissolved by etching, and the resin layer which exsists as the resist may be removed at the end of the procedure.

When the exposure in this image-forming process is carried out by the use of the mask original having the desired image, the light transmitted through a negative or a positive original will be irradiated on the light-sensitive resin layer of the image-formable composite material in a darkroom, as usually carried out in a conventional photographic processing. Since many light-sensitive resins have high sensitivity especially to ultraviolet light, it is preferable to make use of a light source for emitting much ultraviolet ray, for example, an ultra-high pressure mercury lamp, a xenon lamp, a carbon-arc lamp or a chemical lamp, and a yellow lamp can be used as a safety lamp in the darkroom.

In the case that the used light-sensitive resin is a solvent-soluble type, a latent image will be formed on the light-sensitive resin layer by the exposure on the basis of differences in solubility, in a solvent, of the exposed portions and the unexposed portions of the resin layer, as follows: In the case of the positive working type, the unexposed portions of the resin layer will remain solvent-insoluble, but the exposed portions thereof will become easily soluble in the solvent. On the other hand, in the case of the negative working type, the unexposed portions of the resin layer will remain solvent-soluble, but the exposed portions thereof will cure and become inert. The solvent referred to here includes water, aqueous solvents and organic solvents.

Generally, the exposed portions in the case of the positive working type will become alkali-soluble, and the exposed portions in the case of the negative working type will become insoluble in water or an organic solvent. For the purpose of developing the latent image, therefore, the surface having the formed latent image is required to be brought into contact with a solvent which can exhibit a difference in dissolving power to the exposed and unexposed portions. When a commercially available light-sensitive resin is used, an indicated developing solution for the resin should be employed. Accordingly, in the case of the positive working, the unexposed portions of the light-sensitive resin layer will remain, but in the case of the negative working, the exposed portions thereof will cure and remain, in order to form image portions, and in the dissolved non-image portions of the layer, the metallic thin layer thereunder will be nakedly exposed out. On the contrary, in the case that the used light-sensitive resin is a peeling type, a latent image is formed according to the difference in an adhesion of the light-sensitive resin layer to the adjacent layers. That is to say, in the case of the positive working type, the unexposed portions of the resin layer will maintain the character that its adhesion to the metallic thin layer on the support is more than to a peeling material disposed thereover, but the exposed portions of the resin layer will change to the character that its adhesion to the latter is more than to the former; and in the case of the negative working type, the unexposed portions of the resin layer will maintain the character that its adhesion to the metallic thin layer or to the auxiliary layer disposed thereover is more than to the peeling material, but the exposed portions of the resin layer will change to the character that its adhesion to the latter is more than to the former. Accordingly, the development of the latent image can be carried out by peeling the peeling material therefrom which adheres to the surface of the light-sensitive resin layer. After the peeling operation, the image-shaped light-sensitive resin layer which constitutes a resist will be left on the metallic thin layer or on the auxiliary layer disposed thereover.

Next, the composite material for forming the metallic image will be dipped into an etching solution for the metal thin layer to etch the exposed and naked portions of the metallic thin layer, so that these portions of the deposit layer will be removed therefrom and the corresponding portions of the support will be nakedly exposed. On the other hand, the remaining resin layer will serve as the resist against the etching attack, so that the portions, underneath the resist, of the metallic thin layer will remain without being etched and there will be formed image portions retaining an optical density which depends on the thickness of the metallic thin layer. As the etching solution for the metallic thin layer, a known alkali, acid, aqueous oxidizing agent solution or the like can be employed.

The process just described requires the two steps of forming the anticorrosive coating by the exposure and development of the light-sensitive resin and afterwards etching the exposed portions of the metallic thin layer.

However, some of the light-sensitive resins can be developed with, for example, an alkali after exposure, and the employment of such a light-sensitive resin permits the development and etching treatment at one step, i.e. in a monobath, by which the metallic thin layer can be etched simultaneously with the formation of the anti-corrosive pattern by the development of the light-sensitive resin after exposure in order to obtain a desired image therein.

Now, the treating solution suitable for the composite material for forming the metallic image according to this invention will be described in the following:

The developing solution (to which no metal chelating agent according to the present invention is added) referred to here means a metal corroding liquid (an etching solution) for the above-mentioned composite material for forming the metallic image according to this invention. However, some of resins constituting the light-sensitive resin layer can be developed with the etching solution (dissolution or swell of the exposed or the unexposed portions of the light-sensitive resin layer), and the developing solution with regard to this invention may be considered to be a liquid which can carry out the development of both the light-sensitive resin layer and the metallic thin layer in a monobath. That is to say, the applicable methods of using the developing solution according to this invention include a method in which the light-sensitive resin layer is developed to form an anticorrosive pattern and the metallic layer is simultaneously developed in a monobath, and a method in which the light-sensitive resin layer alone is first developed with the developing solution for the light-sensitive resin layer to form and to leave the image-like anticorrosive film and the second development is made with the developing solution for the metallic layer.

The dot etching solution for use in this invention serves to carry out a moderate etching or side etching behavior by its partial application, when it is intended after development to partially correct areas of dots or fine image lines on both the resist and the metallic thin layer, or on the latter alone of the composite material for forming the metallic image. The treating solution for use in this invention means both of the dot etching solution and the developing solution.

As the treating solution (to which no metal chelating agent according to this invention is added) for use in this invention, a known treating solution can be employed in accordance with a metal to be used. Such treating solutions include aqueous alkaline solutions, aqueous acidic solutions, aqueous oxidizing agent solutions and the like. The aqueous alkaline solutions just described include aqueous solutions of lithium hydroxide, sodium hydroxide, potassium hydroxide, rubidium hydroxide, cesium hydroxide, ammonium hydroxide, magnesium hydroxide, sodium carbonate, sodium tertiary phosphate, sodium aluminate, etc. The above-mentioned aqueous acidic solutions include aqueous solutions of phosphoric acid, acetic acid, hydrochloric acid, nitric acid, sulfuric acid, etc. Further, the above-mentioned aqueous oxidizing agent solutions include aqueous solutions of chloric acid, bromic acid, iodic acid, hypobromous acid, hypoiodous acid and their salts, hydrogen peroxide, ferric chloride, etc. Two of such solutions can be used, where required.

The treating solution with regard to this invention can be prepared by adding the metal chelating agent mentioned below to the treating solution just described. The metal chelating agent for use in this invention means a compound capable of producing a chelate compound with a metal of the metallic thin layer disposed over the substrate at the time of etching. As the chelating agent, the materials which are mentioned in, for example, "Metal Chelating Compounds" (A. E. Martel, M. Carbin, Kyoritsu Shuppan) can be employed.

The typical examples of the metal chelating agent for use in the present invention include carboxylic acids such as malonic acid, oxalic acid and succinic acid, and their salts; aliphatic amines such as ethylenediamine, diethylenetriamine, propylenediamine; aromatic amines such as 2,2'-dipyridyl and phenanthroline; natural amino acids such as alanine, aspartic acid, glycine, glutamic acid and proline as well as their salts and peptides; amine acids such as iminodiacetic acid, nitrilotriacetic acid, 1,2-diaminocyclohexane-N,N'-tetraacetic acid, ethylenediaminetetraacetic acid and trimethylenediaminetetraacetic acid, and their salts; oxy acids such as citric acid and tartaric acid, and their salts; condensed phosphoric acids such as pyrophosphoric acid and trillin acid; nitrocarboxylic acids such as nitroacetic acid and o-nitrobenzoic acid, and their salts; salicylaldehydes such as salicylaldehyde and 5-sulfosalicylaldehyde as well as their salts and derivatives; β-diketones such as acetylacetone and furoyl acetone; phenol derivatives such as 8-hydroxyquinoline, orthohydroxyquinoline, 2,4-dihydroxyquinoline, 5-nitroquinoline, 5-nitro-2-aminophenol and 4-nitro-2-aminophenol, and their salts; naphthalene derivatives such as 2,3-dihydroxynaphthalene-6-sulfonic acid, 1-amino-2-naphthalene-4-sulfonic acid, 1-nitroso-2-hydroxynaphthalene-3,6-disulfonic acid and 1,2-naphthoquinone-4-sulfonic acid, and their salts; anthraquinone derivatives such as Alizarine, Alizarine Red S, Alizarine Blue S, Alizarine Saphirol SE, Monosol Fuchsine RS, Alizarine Bordeaux, anthraquinone-α-sulfonic acid, anthraquinone-β-sulfonic acid, anthraquinone-1,5-disulfonic acid, anthraquinone-1,8-disulfonic acid, anthraquinone-2,6-disulfonic acid and anthraquinone-2,7-disulfonic acid, and their salts; and orthohydroxyazo compounds such as Eriochrome Black T and Eriochrome Black A.

The metal chelating agent which can be suitably used in this invention can be added to the treating solution at a concentration of 0.001 mole/l or more, especially preferably 0.005 mole/l or more.

A particularly preferable combination of the metallic thin layer and the treating solution in this invention can be seen in the case that the treating solution in which the metal chelating agent is added to an aqueous alkaline solution is caused to act on the metallic thin layer including Al as a main component.

In this invention, an organic solvent, a surface-active agent or the like can be added to the treating solution, besides the metal chelating agent.

For the purpose of facilitating the contact between the metal portions to be etched and the treating solution (the developing solution) at the time of development, or facilitating the penetration of the treating solution (the dot etching solution) between the light-sensitive resin layer and the metallic thin layer, an organic solvent which can accelerate the swell of the light-sensitive resin may be contained in the treating solution according to this invention. A variety of organic solvents can each be used in accordance with a kind of resin constituting the light-sensitive resin layer of the composite material for forming the metallic image to be treated, but preferable organic solvents include alcohols (e.g., methyl alcohol, ethyl alcohol, benzyl alcohol, etc.), monoethers of alcohols having 1 to 5 carbon atoms and ethylene glycols (e.g., methyl cellosolve, ethyl cellosolve, butyl cellosolve, etc.). The reason why these solvents are preferable is that they do not cause any excessive swell of the resin, can penetrate it moderately, and do not exhibit so excessive a side etching behavior that an etching treatment is carried out even up to sites not to be etched rightfully. The organic solvent may be added to the treating solution in a proportion of 0.1 to 15% by volume, preferably in a proportion of 0.5 to 5% by volume.

With the aim of facilitating a moderate etching behavior, a variety of surface-active agents may be each added to the treating solution according to this invention. Such surface-active agents which are usable in this invention are described in "Surface-Active Agent Handbook" (Hitoshi Takahashi, Kogakutosho), and are also commercially available. Such a surface-active agent may be added to the treating solution according to this invention in a proportion of about $5 \times 10^{-4}$ to 0.1 mole/l, preferably in a proportion of 0.001 to 0.01 mole/l.

The treating solution with regard to this invention can be applied to the composite material for forming the metallic image in an optional manner. For example, the composite material for forming the metallic image may be dipped into the treating solution with regard to this invention, or may be sprayed with the solution. Further, when used particularly as a dot etching solution to each and to thereby correct areas of dots, the treating solution with regard to this invention may be dropped on sites to be reduced by the use of a dropper or the like.

Now, the composite material for forming the metallic image according to this invention will be described in the following:

An illustrative layer constitution of the composite material for forming the metallic image according to this invention comprises a support, a metallic thin layer disposed thereover and a light-sensitive resin layer further disposed thereover, but it may include a modification having an additional constitutional element besides the above-mentioned layers, for example, a modification having an undercoat or an intermediate layer between the respective layers disposed on the support such as between the support and the metallic thin layer or between the metallic thin layer and the light-sensitive resin layer, or a modification having, for example, a protective layer over the light-sensitive resin layer. Therefore, the material for forming the metallic image according to this invention can take an extremely great variety of the layer constitutions.

The metallic layer used in the composite material for forming the metallic image according to this invention comprises a metal capable of being etched by a known etching solution, and examples of such metals including aluminum as a main component which is disclosed in Japanese Provisional Patent Publication No. 139720/1975, and tellurium, molybdenum, polonium, cobalt, zinc, copper, nickel, iron, tin, vanadium, germanium, silver and silver emulsion described in Japanese Provisional Patent Publication Nos. 65927/1973, 65928/1973, 2925/1975 and 14161/1975. The thickness of the metallic thin layer depends on an optical density which is required for an obtained image, and the thickness thereof and the optical density are in a substantially proportional relation. For example, in the case that the image is composed of lines and half tone image, the required optical density is as relatively high as 2.0 or more, and especially in the case the composite material according to this invention is used as a mask at a time of printing a PS printing plate, the optical density of at least 3.0 is necessary, therefore, the thickness of the metallic thin layer is to be determined in accordance with a desired optical density level. The relative relation between the thickness of the metallic thin layer and the optical density varies somewhat with conditions in a method, for example, a vacuum deposition for forming the metallic thin layer, but it is substantially constant in almost cases. It is not particularly forbidden to excessively thicken the metallic thin layer for the purpose of procuring a desired optical density, but this is undesirable because the material of the metallic thin layer is wasteful and a huge sum of time will be taken to carry out an etching treatment for the formation of an image as described hereinafter. Additionally, considering the fact that such an undue etching period of time leads to the deterioration in a resist which will be formed, it should be rather avoided to form the metallic thin layer having an unreasonable thickness.

The support for use in the composite material for forming the metallic image according to this invention can retains thereover directly or indirectly (with the interposition of another layer) the metallic thin layer as a layer to form an image thereon, and can take a variety of morphologies, taking a use of the composite material for forming the metallic image into the consideration. Therefore, as a usual composite materials for forming the image takes, so the composite material for forming the metallic image according to this invention also can take preferably a morphology such as a sheet, a film or a plate, and it can take a transparent, a semitransparent or an opaque state in compliance with its use. The support must not be affected by an etching solution for corroding the metallic thin layer and must not lead to a state where a layer on the support itself is easy to peel off with the etching solution. As materials for the support, many known substances are usable, and their examples include ceramics, amorphous glasses, crystalline glasses, metals, alloys, plastics and their composite materials. These materials may be opaque or transparent, but, where desired, a transparent material may be rendered semitransparent or opaque by adding thereto a colorant or an opacifying agent. However, many uses of the composite material for forming the metallic image according to this invention reside in fields of applying the so-called transmission type, by which an image is formed on the metallic layer of the composite material for forming the metallic image according to this invention, a light is transmitted through non-image line portions where the support is not covered with the metallic layer and thus exposed thereon, and in image portions the light is shut out by the metallic layer. When the composite material for forming the image is used in such a field, the support thereof is required to be transparent. On the other hand, when the composite material for forming the metallic image according to this invention is applied to a field where an image formed is recognized by a reflected light, the support need not be transparent.

A light-sensitive resin layer superimposed over the support can be formed by utilizing a known light-sensitive resin layer for forming a resist. Such light-sensitive resins include all of compounds and compositions such as monomers, prepolymers and polymers which will bring about a chemical change in molecular structure thereof in a short period of time when exposed to a radiation (a near ultraviolet light or a visible light), and which will consequently cause a change in physical properties thereof such as solubility in a solvent or adhesion. (Incidentally, it is natural in the art that the conception of "a light-sensitive resin" includes monomers, prepolymers and the like as mentioned above.) The above light-sensitive resin can be roughly classified into a dissolving type, where a solvent (a solvent medium) is used, and a peeling type by the mechanism of development, and these types can be each classified further into a positive working type and a negative working type. Further, from contents of the chemical change, the resin can be classified into a photo-crosslinkable light-sensitive resin type which will bring about a crosslinking reaction via a metallic ion or will dimerize itself when the resin undergoes an radiation, a type where coexisting photo-decomposable materials will be decomposed when radiated and a closslinking reaction will take place via the resultant decomposed substances, and a type where polymerization will begin when radiated. These types of light-sensitive resin can be used to prepare the composite material for forming the metallic image according to this invention. The light-sensitive resins applicable to the composite material for forming the metallic image according to this invention include not only a lot of known light-sensitive resins but also light-sensitive resins capable of forming light-sensitive resist coatings which will be developed in the future.

In using the light-sensitive resin practically, it is advisable to pay more attention to the classification based on the mechanism of the development than to the classification based on the contents of the chemical change. Reference to the types of the light-sensitive resin will be made in turn: In the case of the light-sensitive resin which forms a solvent-soluble layer, the positive working type resins, as found in the o-quinonediazidos, can each be decomposed by a light radiation to produce a five-membered ring compound having a carboxyl group, so that the resin will become alkaline solution soluble, and the exposed portions of the resin layer will be removed by an alkaline solution at a development stage and the unexposed portions of the light-sensitive resin layer will remain forming desired image line portions; the negative working type resins can each be insolubilized forming a network structure or macromolecules by a light irradiation, and they are typically, for example, a resin having a cinnamoyl group or a diazonium group which will bring about a photo-crosslinking, and acrylamide and acrylate which will bring about a photopolymerization, and these resins will have the unexposed portions removed by the use of a suitable developing agent and will have the exposed portions insolubilized and left forming desired image line portions.

The light-sensitive resins, which are materials each for the light-sensitive resin layer of the composite material for forming the metallic image according to this invention, include various light-sensitive resins usable as resists for photoetching, for example, (1) light-sensitive resins in which orthoquinondiazidos and novolak resins are combined, (2) light-sensitive resins in which diazoresins and water-soluble or alkali-soluble resins are combined, (3) gum-azido type light-sensitive resins in which azido compounds and natural gums, synthetic gums or their cyclized rubbers are combined, (4) light-sensitive resins in which azido groups are incorporated into their molecules, (5) cinnamic acid type light-sensitive resins and (6) photopolymerization type light-sensitive resins having ethylenic unsaturated double bonds.

Now, these light-sensitive resins will be described illustratively in detail, as follows:

As the light-sensitive resins in which orthoquinondiazidos and novolak resins are combined in the preceding paragraph (1), there can be mentioned, for example, light-sensitive resins comprising combinations of the novolak resins and orthoquinondiazidos such as 2,3,4-trihydroxybenzophenone-bis-(naphthoquinone-1,2-diazido-5,5-sulfonic acid ester), 2-(naphthoquinone-1,2-diazido-5-sulfonyloxy)-hydroxy-7-naphthalene, naphthoquinone-1,2-diazido-5-sulfanilido, and naphthoquinone-1,2-diazido-5-sulfonic acid novolak ester. These orthoquinondiazidos are important as materials for the positive working, because they will become alkali-soluble when exposed to light.

As the light-sensitive resins in which diazoresins and water-soluble or alkali-soluble resins are combined in the preceding paragraph (2), there can be mentioned, for example, combinations of water-soluble diazoresins each in which an aromatic diazonium salt and an active carbonyl group-including compound, particularly, an aldehyde, e.g., formaldehyde are condensed in an acidic solvent, or oil-soluble diazoresins each in which an anionic component of each water-soluble diazoresin above is replaced with $BF_4^-$, $PF_6^-$, $SiF_6^{--}$, $SbF_6^{--}$, $BeFe^{--}$, $IO_4^-$ or an organic sulfonate; and water-soluble resins such as gelatin, polyvinyl alcohol, partially saponified polyvinyl acetate, methyl cellulose, hydroxyethyl cellulose, hydroxypropylmethyl cellulose, carboxymethyl cellulose, polyethylene glycol and polyvinyl pyrrolidone, or alkali-soluble resins such as a copolymer of acrylic acid or methacrylic acid and styrene, methylmethacrylate, 2-hydroxyethylmethacrylate or glycidylmethacrylate.

As the gum-azido type light-sensitive resins in the previous paragraph (3), there can be mentioned, for example, light-sensitive resins in which natural gums, synthetic gums or their cyclized rubbers are combined with azido compounds such as p-phenylenebisazido, p-azidobenzophenone, 4,4'-diazidobenzophenone, 4,4'-diazidophenylmethane, 4,4'-diazidostilbene, 4,4'-diazido-chalcone, 2,6-di-(4'-azidobenzal)cyclohexane and 2,6-di-(4'-azidobenzal)-4-methylcyclohexanone.

As the light-sensitive resins in which azido groups are incorporated into their molecules in the previous paragraph (4), there can be mentioned, for example, polyazido vinyl benzoate, polyazido vinyl phthalate, polyazido styrene, polyvinylazidobenzalacetal, polyvinylazidonaphthylacetal, azidobenzaldehyde phenolic resin, azidophenylamine formalin condensation polymer, azidopolymers of polyvinylalcohol, azidopolymers of cellulose such as azidophthalate of partially hydrolyzed cellulose acetate and azidopolymers such as gelatin and casein.

As the cinnamic acid type light-sensitive resins in the previous paragraph (5), there can be mentioned, for example, vinyl polymers such as vinyl polycinnamate, poly(m-vinyl nitrocinnamate), poly-$\alpha$- cyanocinnamate, poly-$\alpha$-vinyl nitrocinnamate, poly-$\beta$-vinyl nitrocinnamate, poly-$\beta$-vinyl chlorocinnamate, poly-$\beta$-vinyl chlorocinnamate, polycinnamylidenevinyl acetate, polyvinyloxyethyl cinnamate, polyvinylthioethyl cinnamate, poly(2-cinnamoyloxy-ethyl acrylate), poly(2-cinnamoyloxyethyl methacrylate), poly(cinnamoyloxyvinyl acetate), poly(p-cinnamoyloxy-vinylbenzene) and poly(p-cinnamoylstyrene); copolymers of these vinyl polymers and other polymers; polymers having opened oxirane rings such as glycidyl polycinnamate and glycinyl polycinnamylideneacetic acid; polymers each in which all or part of light-sensitive groups of a carboxylate is introduced into a polymer including an alkyl halide on its side chain by causing these compounds to carry out a polymerization reaction in a nonproton polare solvent, for example, polymers obtained by reacting salts of cinnamic acid or its derivatives with polychloroethylvinyl ether, polychlorovinyl acetate, poly($\beta$-chloroethylacrylic acid ester), polyepichlorohydrin and polyepibromohydrin; and cationic polymers of vinyl ethers, for example, polyvinyloxyethyl cinnamate.

Of the cinnamic acid type light-sensitive resins, a mixture of an unsaturated light-sensitive polyester compound disclosed in the specification of U.S. Pat. No. 3,030,208 and a light-sensitive resin represented by the following chemical formula is highly preferable. The latter light-sensitive resin is a polymer including, as units, (A) —$CH_2$—$CR_1COOR_2CO$—$(CR_3$=$CH)_a$(CH=$CH)_b$ $R_4$ (wherein $R_1$ is a hydrogen atom, a halogen atom, a nitrile group or a lower alkyl group, $R_2$ is a bivalent aliphatic group, $R_3$ is a hydrogen atom or a nitrile group, $R_4$ is an aromatic nucleus, a and b each are 0 or 1 and a+b is 1 or 2), and (B) acrylic acid or methacrylic acid.

As examples of the photopolymerization type light-sensitive resins having ethylenic unsaturated double bonds in the previous paragraph (6), specific monomers and polymerizable materials are disclosed in the specifications of U.S. Pat. Nos. 276,083 and 3,060,026, but suitable examples of the monomers include acrylates and methacrylates of polyhydric alcohols, for example, acrylates and methacrylates of ethylene glycol, triethylene glycol, tetraethylene glycol, propylene glycol, trimethylolpropane, pentaerythritol, neopentyl glycol and the like. There can be also used esters of acrylic acid and methacrylic acid and those which are introduced from bisphenol A in a manner of modification, for example, a reaction product of a bisphenol A-epichlorohydrin type epoxy resin prepolymer and acrylic acid or methacrylic acid, and an ester of acrylic acid or methacrylic acid and an addition product between bisphenol A and an alkylene oxide or a product obtained by hydrogenizing the addition product. Further, usable examples include methylenebisacrylic amide; ethylenebisacrylic amide; bisacrylic amide or bismethacrylic amide of diamines such as ethylenediamine, propylenediamine, butylenediamine and pentamethylenediamine; a reaction product of diolmonoacrylate or diolmonomethacrylate and a diisocyanate; triacrylformal; and triacryl cyanurate.

The light-sensitive resin described above is usually combined with other components and is in a state of a liquid or solid composition, and in the case that it is liquid, it can be applied simply to the metallic thin layer over the previously prepared support, or the intermediate auxiliary layer over the metallic thin layer; in the case that it is solid, it will be usually shaped into a filmy form, and the shaped resin will be superimposed over the layer and will be pressed thereagainst under heating. The solid light-sensitive resins having other shapes will be dissolved in an organic solvent and the resultant solution will be utilized in like manner above. A known molding process can be applied in the case that the light-sensitive resin with regard to this invention will be molded.

An image-wise etching resistant layer superimposed over the metallic thin layer is hereby meant to be a layer which acts as a resist to the dot etching solution when the composite material of this invention has been dipped in the dot etching solution, and which has been formed image-wise.

The preparation of the image-wise resistant layer according to this invention can be accomplished by, for example, (1) forming a light-sensitive resin layer upon the metallic thin layer, exposing the light-sensitive resin layer to the light and then developing said layer, (2) transferring the already formed image-wise resistant layer onto the metallic thin layer superimposed over the support, or (3) transferring an ink which is insoluble to the dot etching solution onto the metallic thin layer superimposed over the support by conventional printing.

The metal chelating agent for use in the composite material for forming the metallic image according to this invention means a material capable of producing a chelating compound with a metal of the metallic thin layer over the support at the time of etching. As the chelating agents, the materials which are mentioned in, for example, above-described "Metal Chelating Compounds" can be employed.

As typical manners of incorporating the above metal chelating agent into at least one layer, there are the following five cases: a case of incorporating it into the metallic thin layer superimposed over the support, a case of incorporating it into the light-sensitive resin layer superimposed over the metallic thin layer, a case of incorporating it into the intermediate layer (between the metallic thin layer and the light-sensitive resin layer), a case of incorporating it into the undercoat layer (between the support and the metallic thin layer), and a case of incorporating it into the protective layer which may be superimposed over the light-sensitive resin layer. However, two or more of these cases may be combined, and a great variety of layer constitutions may be taken virtually.

Although depending on a selected manner of the above-mentioned layer constitutions, amount of the metallic chelating agent to be added other than the metallic thin layer is not less than about 0.001 g/m$^2$, particularly preferably, not less than about 0.01 g/m$^2$.

In the case of incorporating the metal chelating agent into the metallic thin layer, it is preferable to form a metal deposit layer (hereinafter referred to as a metal-metal chelating agent including deposit layer) which includes a metal chelating agent capable of being deposited together with a metal.

A metal for use in the metal-metal chelating agent including deposit layer according to this invention is one capable of being etched by a known etching solution, and examples of such metals are illustrated hereinbefore.

The metal chelating agents usable in this invention are mentioned hereinbefore. Such a chelating agent must have, as necessary requirements, properties of being solid at ordinary temperature or more and of accepting a vacuum deposition. It is preferred that a melting point and a sublimating temperature of the metal chelating agent are as low as possible, and it is also preferred that its stability before or after deposition is good.

Examples of the metal chelating agents for use in this invention include, as mentioned above, a natural amino acid and a peptide, an oxyacid, a condensed phosphate, a nitrocarboxylic acid, a salicylaldehyde, a β-diketone, a phenol derivative, a naphthalene derivative, a hydroxyazo dye and an anthraquinone derivative, and a compound other than these are excluded from the scope of this invention because of being able to achieve no objects of this invention.

The metal chelating agent described above may be used alone or in a suitable combination in this invention.

The metal-metal chelating agent including deposit layer of the composite material for forming the metallic image according to this invention may be formed by vacuum depositing a metal and a metal chelating agent over a support, but this vacuum deposition may be accomplished in a manner named the so-called simultaneous deposition. That is to say, the metal and the metal chelating agent to be deposited may be placed in separate vapor sources in a vaccum depositing device and heated to evaporating temperatures of the respective materials by means of separate heaters, and the evaporation may be carried out simultaneously from the vapor sources toward the support disposed at a position where the deposition will be made. In some cases, two or more kinds of vapor materials may be evaporated from one vapor source. Since the metal and the metal chelating agent are always simultaneously deposited in this way, the deposit layer will be formed in the mixing state of the metal and the metal chelating agent. A mixing ratio of them and a thickness of the deposit layer may be selected optionally in accordance with a use. In terms of the layer thickness ratio on the supposition that the metal and the metal chelating agent are separately and independently deposited in the form of layer, the ratio of the metal chelating agent to the metal is preferably within the range of 0.01 to 5 times, more preferably within the range of 0.1 to 2 times. In the composite material for forming the metallic image according to this invention, the deposit layer is usually within 20 nm to 3000 nm or so in thickness, but the determination of the layer thickness can be carried out suitably in accordance with optical properties and other physical or chemical properties of a material to be deposited, or a use of the composite material for forming the metallic image.

Obscure and indefinite is the structure of the metal-metal chelating agent including layer which may be formed by such a simultaneous deposition as described above. It can be supposed that the metal and the metal chelating agent would be mutually reacted to produce a new compound, which would be a particulate mixture in a merely uniform molecular dispersion. Further, it can be considered that one material would be dispersed in another parent body in a particulate form. Although the structure of the deposit layer can be presumed variously, this invention can accept any structure thereof, so long as it satisfies conditions of the desired optical density as well as anticorrosion and adhesion which will be described hereinafter. A deposition means for use in this invention include, not to speak of a vacuum deposition of a usual resistance heating system, an electron beam heating deposition, a sputtering process, an ion plating process and the like.

The composite material for forming the metallic image according to this invention may be provided with an anti-halation layer or a protective layer, if desired, as in the case of a usual photographic material.

The preparation of the composite material for forming the metallic image with regard to this invention can be accomplished by forming a desired metallic layer over the surface of the specified support in a fashion such as a vacuum deposition, a spattering process, an ion plating process, an electrodeposition, an electrophoresis, a gaseous phase deposition or a spray process, and further by forming (with the interposition of an intermediate layer, if desired) a light-sensitive resin layer (additionally, a protective layer, if desired) over the metallic layer. In the case that a selected metal chelating agent is incorporated into a light-sensitive resin layer, a liquid to be coated will be prepared by dissolving selected one or more of the above-mentioned light-sensitive resins together with the metal chelating agent in water or an organic solvent. In the case that the metal chelating agent is incorporated into the optional intermediate layer between the light-sensitive resin layer and the metallic thin layer, the undercoat layer between the substrate and the metallic thin layer, or the protective layer over the light-sensitive resin layer a material for use in each layer will be dissolved together with a metal chelating agent in water or an organic solvent. The metallic layer will be then coated thereover with the thus prepared liquid in a known coating manner such as a roller coating process, an air-knife coating process, a dipping process, a curtain coating process or a spray coating process, and it will be dried to form a desired light-sensitive resin layer. The dried light-sensitive resin layer should be within the range of 0.1 to 10$\mu$ or so in thickness. When the light-sensitive reins layer is too thin, it will be too weak to work as a resist layer, and on the contrary, when being too thick, the layer will take much time to complete etching and cause the problem that any faithful image corresponding to a given image cannot be obtained on the resist. The selection of a site where the metal chelating agent will be incorporated is carried out in accordance with a used light-sensitive resin and an etching solution or an etching manner (a monobath or a two-bath), but it is anyway necessary that the chelating agent will exists in non-image portions at the time of the supply of the etching solution for the metallic thin layer.

The process for forming the metallic image by use of the treating solution containing the metal chelating agent according to this invention permits an extremely prompt etching treatment and thus noticeable reduction in operating time. Moreover, when the treatment is carried out with the treating solution above, no foam will occur at the etching stage of the metal in the metallic thin layer, no irregularity of the etching behavior will be observed, because the treating solution can always maintain a good wed contact state with the metal to be etched, and the analogy between shapes of the dots before and after the reducing treatment thereof is especially fine. Further, the treating solution with regard to this invention, since not requiring any hazardous materials in storage or under handling, can have high safety.

Moreover, since the composite material for forming the metallic image with regard to this invention contains the metal chelating agent in at least one layer on the support, even if there is used a metal etching solution which comprises an aqueous solution including so weak an alkali, an acid or an oxidizing agent as not to attack the resist, the etching treatment can be accomplished satisfactorily in a short period of time, with the result that an operating time can be noticeably reduced, and it will also be possible to obtain an image excellent in sharpness of edges in etched portions.

Further, since comprising the metal-metal chelating agent including deposit layer, the composite material for forming the metallic image can have a predetermined optical density from the beginning, and since the light-sensitive resin layer for exhibiting an excellent definition is etched in forming an image, the obtained image can have a higher contrast and definition. Additionally, the metal-metal chelating agent including deposit layer with regard to this invention can provide much better etching properties, as compared with a layer including a single metal. The etching properties referred to above mean a time necessary for etching and a sharpness of etched portions.

The following examples will be given to illustrate this invention, but they are not intended to limit the scope of this invention.

EXAMPLE 1

About 400 mg of Al was placed in an $Al_2O_3$ boat vapor source disposed in a vacuum depositing device, and a polyethylene telephthalate film (a support) of 100$\mu$ in thickness was arranged so as to be about 30 cm distant from the vapor source. Under the condition that a degree of vacuum was $5 \times 10^{-5}$ Torr, an Al deposit coating (a metallic thin layer) of 800 Å in thickness was obtained. The obtained deposit coating was coated by whirler thereover with a light-sensitive resin composition comprising the undermentioned components so as to be 1.5$\mu$ in thickness after drying, and was then dried at 100° C. for 5 minutes in a drying chamber:

| | |
|---|---|
| Copolymer of styrene and methacrylic acid (styrene/methacrylic acid = 70/30) | 5 g |
| Pentaerythritol triacrylate | 5 g |
| 2-Isopropylthioxanthone | 1 g |
| Dimethylaminoisoamyl benzoate | 0.5 g |
| Methyl cellosolve | 100 ml |

A sample of the thus obtained composite material for forming the metallic image was pattern exposed to light through a half tone original for 20 seconds by the use of Daylight Printer UP-6 (3 kw metal halide lamp manufactured by Ueno Kagaku Co., Ltd.), and was dipped into a developing solution comprising the undermentioned components with regard to this invention:

| | |
|---|---|
| Sodium hydroxide | 4 g |
| Anthraquinone-2,6-sodium disulfonate | 10 g |
| Water | 1 l |

At this time, the foaming phenomenon which would result from the etching of the metallic thin layer was inhibited completely, and under the conditions that a temperature of the used developing solution was 25° C. and the dipping treatment was carried out for 30 seconds, the unexposed portions of the metallic thin layer were removed completely, on the other hand, the exposed portions thereof were inverted substantially completely to the original in highlights and shadows, which fact was confirmed by making measurement with the aid of a dot area-measuring equipment, Areadac (manufactured by Konishiroku Photo Industry Co., Ltd.). On the contrary, in the case of the treatment by the use of a comparative developing solution which comprised the above-mentioned developing solution, however, without any anthraquinone-2,6-sodium disulfonate, great foam occurred and some metal was left in the form of dew point in the unexposed portions. Further, the development stage took as long a period of time as 3 minutes.

EXAMPLE 2

The sample of the developed light-sensitive material which was obtained in Example 1 was dipped into a dot etching solution comprising the undermentioned components with regard to this invention:

| | |
|---|---|
| Sodium hydroxide | 2 g |
| Anthraquinone-2,6-sodium disulfonate | 6 g |
| Water | 1 l |

After the dot etching treatment at a solution temperature of 25° C. for 1 minute, the dots of the sample were etched by about 10%, and the analogy between the dots before and after the reduction was good.

On the contrary, in the case of the dot etching by the use of a comparative liquid which comprised the above-mentioned dot etching agent, however, without any anthraquinone-2,6-sodium disulfonate, it was found that etched dots were bad in shape and each dot had locally tardily etched portions.

EXAMPLE 3

A suitable amount of an $Al_2Fe$ alloy was placed in an $Al_2O_3$-boat vapor source disposed in a vacuum depositing device, and a polyethylene telephthalate film (a support) of $100\mu$ in thickness was arranged in a circular form so as to be about 30 cm distant from the vapor source. Under the condition that a degree of vacuum was $5\times10^{-5}$ Torr, there was obtained an aluminum-iron alloy deposit film (a metallic thin film) of 800 Å in thickness. This deposit film was further coated thereover with the light-sensitive resin composition in the same manner as in Example 1.

The thus obtained sample was exposed to light in the same manner as in Example 1 and was dipped into a treating solution comprising the following components:

| | |
|---|---|
| Sodium hydroxide | 4 g |
| Sodium 4-nitro-2-aminophenolate | 10 g |
| Benzyl alcohol | 20 ml |
| Water | 1 l |

At this time, a foaming phenomenon which would result from the etching of the metallic thin layer was inhibited completely. Further, since the unexposed portions of the resin were swelled out by the used benzyl alcohol, the penetrating rate of the alkaline solution was great, and under the conditions that the temperature of the used treating solution was 25° C. and the dipping treatment was carried out for 10 seconds, the unexposed portions of the metallic thin layer were removed completely, on the other hand, the exposed portions thereof were inverted substantially completely to the original in high-lights and shadows.

EXAMPLE 4

A suitable amount of Bi was placed in a Ta-boat vapor source disposed in a vacuum depositing device, and a polyethylene telephthalate film (a support) of $100\mu$ in thickness was arranged so as to be about 30 cm distant from the vapor source. Under the condition that a degree of vacuum was $5\times10^{-4}$ Torr, a Bi deposit alloy film (a metallic thin layer) of 2000 Å in thickness was obtained. This deposit film was coated by whirler thereover with a positive type photoresist, AZ-1350 (which was a light-sensitive liquid manufactured by Shipley Co., Ltd.) so as to be $1.5\mu$ in thickness after drying, and was dried at 100° C. for 5 minutes in a drying chamber. The sample of the thus obtained light-sensitive material was pattern exposed to light through a half tone original for 45 seconds by the use of Daylight Printer UP-6, and was developed with "a developing solution for AZ-1350 Light-Sensitive Liquid" mentioned above which was commercially available together with the above-mentioned light-sensitive liquid, so that a resist having an image corresponding to the original was formed from the light-sensitive resin layer.

Next, this sample was dipped into a developing solution comprising the undermentioned components with regard to this invention:

| | |
|---|---|
| Ferric chloride | 60 g |
| Sodium ethylenediaminetetraacetate | 20 g |
| Water | 1 l |

At this time, under the conditions that a temperature of the developing solution was 25° C. and the dipping period of time was 10 seconds, the exposed portions, not covered with the resist, of the Bi-metallic thin layer were completely removed, on the other hand, the resist-covered portions of the metallic thin layer remained and corresponded to the original substantially completely in high-lights and shadows. On the contrary, in the case of the treatment by the use of a comparative developing solution which comprised the above-mentioned developing solution, however, without any sodium ethylenediaminetetraacetate, the developing stage required as long a period of time as 2 minutes.

EXAMPLE 5

A suitable amount of Al was placed in an $Al_2O_3$-boat vapor source disposed in a vacuum depositing device, and a polyethylene telephthalate film (a support) of $100\mu$ in thickness was arranged so as to be about 30 cm distant from the vapor source. Under the condition that a degree of vacuum was $5\times10^{-5}$ Torr, an Al deposited alloy film (a metallic thin layer) of 800 Å in thickness was obtained. This deposit film was coated by whirler thereover with a light-sensitive resin composition comprising the undermentioned components so as to be $2\mu$ in thickness after drying, and was dried at 100° C. for 5 minutes in a drying chamber:

| | |
|---|---|
| Copolymer emulsion of polyvinyl acetate and long-chain acrylate (Gelva TS-100 manufactured by Monsanto Corp.) | 100 ml |
| Diazo resin (Fairmount #4) | 4 g |

The sample of the thus obtained light-sensitive material was pattern exposed to light through a half tone original for 20 seconds by the use of Daylight Printer UP-6, and was dipped into a developing solution comprising the undermentioned components:

| | |
|---|---|
| Phosphoric acid | 200 ml |
| Anthraquinone-2,7-sodium disulfonate | 40 g |
| Water | 1 l |

At this time, under the conditions that a temperature of the developing solution was 25° C. and a dipping period of time was 60 seconds, it was found that the unexposed portions of the metallic thin layer were removed completely, on the other hand, the exposed portions of the metallic thin layer were inverted substantially completely to the original in highlights and shadows. On the contrary, in the case of the treatment by the use of a developing solution which comprised the above-mentioned developing solution, however, without any anthraquinone-2,7-sodium disulfonate, the development stage required as long a period of time as 10 minutes.

EXAMPLE 6

About 400 mg of Al was placed in an $Al_2O_3$-boat vapor source disposed in a vacuum depositing device, and a polyethylene telephthalate film (a support) of $100\mu$ in thickness was arranged so as to be about 30 cm distant from the vapor source. Under the condition that a degree of vacuum was $5 \times 10^{-5}$ Torr, an Al deposited coating of 800 Å in thickness was obtained. The obtained deposited coating was coated by whirler thereover with a light-sensitive resin composition comprising the undermentioned components so as to be $2.5\mu$ in thickness after drying, and it was then dried at 100° C. for 5 minutes in a drying chamber:

| | |
|---|---|
| Copolymer of styrene and methacrylic acid (styrene/methacrylic acid = 70/30) | 5 g |
| Pentaerythritol triacrylate | 5 g |
| 2-Isopropylthioxanthone | 1 g |
| Anthraquinone-2,6-disulfonic acid | 2 g |
| Methyl cellosolve | 100 ml |

A sample of the thus obtained composite material for forming the metallic image was pattern exposed to light through a half tone original for 20 seconds by the use of Daylight Printer UP-6 (3 kw metal halide lamp manufactured by Ueno Kagaku Co., Ltd.), and was dipped into a 0.1 N aqueous sodium hydroxide solution having a temperature of 25° C. for 30 seconds. It was found that the unexposed portions of the metallic thin layer were removed completely and the exposed portions thereof were inverted substantially completely to the original in highlights and shadows, and edges of the dots were good in sharpness.

On the contrary, a similar composite material for forming the metallic image was prepared by the use of the above-mentioned light-sensitive resin composition, however, excluding the anthraquinone-2,6-disulfonic acid, and was treated with the aforesaid etching solution. It was found that the etching operation took as long a period as 3 minutes, and edges of the obtained half tone image were bad in sharpness.

EXAMPLE 7

A suitable amount of an $Al_2F$ alloy was placed in an $Al_2O_3$-boat vapor source disposed in a vacuum depositing device, and a polyethylene telephthalate film (a support) of $100\mu$ in thickness was arranged so as to be about 30 cm distant from the vapor source. Under the condition that a degree of vacuum was $5 \times 10^{-5}$ Torr, an aluminum-iron alloy film of 800 Å in thickness was obtained. The obtained deposited coating was coated by whirler thereover with a light-sensitive resin composition comprising the undermentioned components so as to be $2.0\mu$ in thickness after drying:

| | |
|---|---|
| Copolymer of methyl methacrylate and methacrylic acid (methyl methacrylate/methacrylic acid = 80/20) | 5 g |
| Pentaerythritol triacrylate | 5 g |
| 2-Isopropylthioxanthone | 1 g |
| Dimethylaminoisoamyl benzoate | 0.5 g |
| Methyl cellosolve | 100 ml |

Next, the resultant light-sensitive resin layer was coated by whirler thereover with a composition comprising the undermentioned components to form a protective layer of $2.0\mu$ in thickness:

| | |
|---|---|
| Polyvinyl alcohol (PVA-GL-05 manufactured by Nippon Gosei Kagaku Co., Ltd.) | 10 g |
| Sodium 4-nitro-2-aminophenolate | 3 g |
| Water | 100 ml |

The thus obtained sample was exposed to light in the same manner as in Example 6, and was dipped into a 0.1 N aqueous sodium hydroxide solution having a temperature of 25° C. for 10 seconds. It was found that the unexposed portions of the metallic thin layer were completely removed and the exposed portions thereof were inverted substantially completely to the original in highlights and shadows.

EXAMPLE 8

An Al deposited coating which was prepared in the same manner as in Example 6 was coated by whirler thereover with a composition comprising the undermentioned components to form an adhesive layer (an intermediate layer) so as to be $1\mu$ in thickness after drying:

| | |
|---|---|
| Copolymer of hydroxyphenylmethacrylic amido, acrylonitrile, methylmethacrylate, and methacrylic acid (30/40/25/5, respectively) | 5 g |
| 5-Nitro-2-aminophenol | 2 g |
| Methyl cellosolve | 100 ml |

Next, the resultant adhesive layer was coated by whirler thereover with a light-sensitive resin composition comprising the undermentioned components so as to be $2.0\mu$ in thickness after drying:

| | |
|---|---|
| Copolymer emulsion of polyvinyl acetate and long-chain acrylate (Gelva TS-100 manufactured by Monsanto Corp.) | 100 ml |
| Diazo resin (Fairmount #4) | 4 g |

The thus obtained sample was exposed to light in the same manner as in Example 6, and was developed for 10 seconds with tap water. Next, the sample was, after the heat treatment at 100° C. for 5 minutes, dipped into an 0.1 N aqueous sodium hydroxide solution having a temperature of 25° C. for 30 seconds. As a result, it was found that the unexposed portions of the metallic thin layer were substantially completely removed and the exposed portions thereof were inverted to the original in highlights and shadows, and edges of the dots had a good sharpness.

EXAMPLE 9

A polyethylene telephthalate film (a support) of $100\mu$ in thickness was coated thereover with a composition comprising the undermentioned components so as to be 1μ in thickness after drying, in order to form an undercoat:

| Cresolnovolak resin (manufactured by Gunei Kagaku Co., Ltd.) | 5 g |
|---|---|
| Eriochrome Black T | 2 g |
| Methyl cellosolve | 100 ml |

Next, an Al deposited coating was disposed over the formed undercoat in the same manner as in Example 6, and the deposited coating was further coated with a composition comprising the undermentioned components so as to be 2.5μ in thickness after drying, in order to form a light-sensitive resin layer:

| Cresolnovolak resin (manufactured by Gunei Kagaku Co., Ltd.) | 2.5 g |
|---|---|
| 1,2-Naphthoquinonediazido-5-sulfonate of cresolnovolak resin (esterification percent = 25 mole %) | 5 g |
| Methyl cellosolve | 100 ml |

The sample of the thus obtained light-sensitive material was exposed to light and developed at a liquid temperature of 25° C. for 35 seconds in the same manner as in Example 6, and it was found that the exposed portions of the metallic thin layer were removed completely and the unexposed portions thereof corresponded substantially completely to the original in highlights and shadows, and edges of dots were good in sharpness.

EXAMPLE 10

Aluminum and anthraquinone-2,6-disulfonic acid were placed separately in two vapor sources, which were sectioned mutually, in a vacuum depositing device, and a metal-metal chelating agent including deposit layer comprising the aluminum of 600 Å in terms of thickness and the anthraquinone-2,6-disulfonic acid of 600 Å in terms of thickness was formed on a polyethylene telephthalate film (a support) of 100μ in thickness under the condition that a degree of vacuum was $5 \times 10^{-5}$ Torr.

The deposit layer was coated by whirler thereover with a light-sensitive resin composition comprising the undermentioned components so as to be 2.0μ in thickness after drying, and was dried at 100° C. for 5 minutes in a drying chamber:

| Copolymer of styrene and methacrylic acid (styrene/methacrylic acid = 70/30) | 5 g |
|---|---|
| Pentaerythritol triacrylate | 5 g |
| Diisopropylthioxanthone | 1 g |
| Methyl cellosolve | 100 ml |

A sample of the thus obtained composite material for forming the metallic image was pattern exposed to light through a half tone original for 20 seconds by the use of Daylight Printer UP-6 (3 kw metal halide lamp manufactured by Ueno Kagaku Co., Ltd.), and was dipped into a 0.1 N aqueous sodium hydroxide solution having 25° C. for 15 seconds. It was found that the unexposed portions of the deposit layer were removed completely and the exposed portions thereof were inverted substantially completely to the original in highlights and shadows, and edges of the obtained image had a good sharpness.

With regard to the image obtained in this Example, its optical density was 3.0 or more and its resolving power was 100 lines/mm or more.

EXAMPLE 11

A metal-metal chelating agent including deposit layer comprising aluminum of 600 Å in terms of thickness and 4-nitro-2-aminophenol of 400 Å in terms of thickness was formed on a polyethylene telephthalate film (a support) of 100μ in thickness in the same manner as in Example 10.

The formed deposit layer was coated by whirler thereover with a positive working type photoresist, AZ-1350 (a light-sensitive liquid manufactured by Shipley Co., Ltd.), and was then dried.

The thus obtained sample was exposed to light in the same manner as in Example 10 and was developed with a developing solution for AZ-1350, so that an image resist corresponding to a used positive original was formed from the light-sensitive resin layer.

Next, this sample was dipped into a 0.1 N aqueous sodium hydroxide solution having a temperature of 25° C. for 10 seconds, so that non-image portions, not covered with the resist, of the deposit layer were etched and removed. With regard to the obtained image, its optical density was 3.0 or more, its resolving power was 100 lines/mm or more, and its edges were good in sharpness.

EXAMPLE 12

A metal-metal chelating agent including deposit layer comprising bismuth of 1500 Å in terms of thickness and citric acid of 700 Å in terms of thickness was formed on a polyethylene telephthalate film (a support) of 100μ in thickness in the same manner as in Example 10.

A light-sensitive resin layer was formed on the formed deposit layer in the same manner as in Example 11, followed by exposure and development to form an image resist.

Next, the sample was dipped into a 6% aqueous ferric chloride solution having a temperature of 25° C. for 10 seconds to etch and to then remove non-image portions, not covered with the resist, of the deposit layer. As for the obtained image, its optical density was 3.0 or more, its resolving power was 100 lines/mm or more, and its sharpness of image edges was good.

COMPARATIVE EXAMPLE 1

A deposit layer comprising aluminum of 600 Å in terms of thickness and behenic acid of 600 Å in terms of thickness was formed on a polyethylene telephthalate film (a substrate) of 100μ in thickness, and the formed deposit layer was coated thereover with the light-sensitive resin composition in the same manner as in Example 10 in order to obtain a composite material for forming a metallic image.

Next, the sample of the obtained material was exposed to light in the same manner as in Example 1 and dipped into a 0.1 N aqueous sodium hydroxide solution having a temperature of 25° C. for 90 seconds to obtain an image, but side etching phenomena were observed in the obtained image.

I claim:

1. In a composite material for forming a metallic image, comprising a support, a metallic thin layer over said support, and a light-sensitive resin layer or an image-wise etching resistant layer over said metallic thin layer, wherein the improvement comprises a metal chelating agent being included in at least one layer over the support.

2. The composite material of claim 1, wherein said composite material further comprises at least one layer selected from the group consisting of an intermediate layer which is positioned between said metallic thin layer and said light-sensitive resin layer, an undercoat layer which is positioned between said support and said metallic thin layer, and a protective layer which is superimposed over said light-sensitive resin layer.

3. The composite material of claim 1, wherein said metal chelating agent is present in an amount of not less than about 0.001 g/m² in any of said layers other than said metallic thin layer.

4. The composite material of claim 3, wherein said metal chelating agent is present in an amount of not less than about 0.01 g/m² in any of said layers other than said metallic thin layer.

5. The composite material of claim 1, wherein said metallic thin layer is a deposit layer containing a metal and said metal chelating agent.

6. The composite material of claim 5, wherein the ratio of said metal chelating agent to said metal is within the range of 0.01 to 5.

7. The composite material of claim 6, wherein the ratio of said metal chelating agent to said metal is within the range of 0.1 to 2.

8. The composite material of claim 5, wherein said deposit layer has a thickness of 20 to 3000 nm.

9. The composite material of claim 1, wherein said metallic thin layer consists essentially of aluminum.

10. The composite material of claim 1, wherein said metal chelating agent is selected from the group consisting of a carboxylic acid and salts thereof, an aliphatic amine, an aromatic amine, an amino acid and salts and peptides thereof, an amine acid and salts thereof, an oxyacid and salts thereof, a condensed phosphoric acid and salts thereof, a nitrocarboxylic acid and salts thereof, a salicyaldehyde and salts and derivatives thereof, a -diketone, derivatives of phenol and salts thereof, derivatives of naphthalene and salts thereof, derivatives of anthraquinone and salts thereof and an ortho-oxyazo compound.

11. The composite material of claim 10, wherein said metal chelating agent is selected from the group consisting of malonic acid, oxalic acid, succinic acid and salts thereof, ethylene diamine, diethylene triamine, propylene diamine, 2,2'-dipyridyl, phenanthroline, alanine, aspartic acid, glycine, glutamic acid, proline and salts thereof, iminodiacetic acid, nitrilotriacetic acid, 1,2-diaminocyclohexane-N,N'-tetraacetic acid, ethylenediaminetetraacetic acid, trimethylenediaminetetraacetic acid and salts thereof, citric acid, tartaric acid and salts thereof, pyrophosphoric acid, triphosphoric acid, nitroacetic acid, o-nitrobenzoic acid and salts thereof, salicylaldehyde, 5-sulfosalicylaldehyde and salts thereof, acetylacetone, furoylacetone, 8-hydroxyquinoline, orthohydroxyquinoline, 2,4-dihydroxyquinoline, 5-nitroquinoline, 5-nitro-2-aminophenol, 4-nitro-2-aminophenol and salts thereof, 2,3-dihydroxynaphthalene-6-sulfonic acid, 1-amino-2-naphthalene-4-sulfonic acid, 1-nitriso-2-hydroxynaphthalene-3, 6-disulfonic acid, 1,2-naphthoquinone-4-sulfonic acid and salts thereof, Alizarine, Alizarine Red S, Alizarine Blue S, Alizarine Saphirol SE, Monozol Fuchsine RS, Alizarine Bordeaux, anthraquinone-sulfonic acid, anthraquinone-sulfonic acid, anthraquinone-1,5-disulfonic acid, anthraquinone-1,8-disulfonic acid, anthraquinone-2,6-disulfonic acid, anthraquinone-2,7-disulfonic acid and salts thereof, Eriochrom Black T and Eriochrom Black A.

12. A process for forming a metallic image, which comprises exposing a composite material, said composite material comprising a transparent support, a metallic thin layer over said support and a light-sensitive resin layer over said metallic thin layer, and treating said exposed composite material with a developing solution containing a metal chelating agent, to thereby develop said light-sensitive resin layer and said metallic thin layer in a single bath.

13. The process of claim 12, wherein said metal chelating agent is selected from the group consisting of a carboxylic acid and salts thereof, an aliphatic amine, an aromatic amine, an amino acid and salts and peptides thereof, an amine acid and salts thereof, an oxyacid and salts thereof, a condensed phosphoric acid and salts thereof, a nitrocarboxylic acid and salts thereof, a salicyaldehyde and salts and derivatives thereof, a β-diketone, derivatives of phenol and salts thereof, derivatives of naphthalene and salts thereof, derivatives of anthraquinone and salts thereof, and an ortho-oxyazo compound.

14. The process of claim 13, wherein said metal chelating agent is selected from the group consisting of malonic acid, oxalic acid, succinic acid and salts thereof, ethylene diamine, diethylene triamine, propylene diamine, 2,2'-dipyridyl, phenanthroline, alanine, aspartic acid, glycine, glutamic acid, proline and salts thereof, iminodiacetic acid, nitrilotriacetic acid, 1,2-diaminocyclohexane-N,N'-tetraacetic acid, ethylenediaminetetraacetic acid, trimethylenediaminetetraacetic acid and salts thereof, citric acid, tartaric acid and salts thereof, pyrophosphoric acid, triphosphoric acid, nitroacetic acid, o-nitrobenzoic acid and salts thereof, salicylaldehyde, 5-sulfosalicylaldehyde and salts thereof, acetylacetone, furoylacetone, 8-hydroxyquinoline, orthohydroxyquinoline, 2,4-dihydroxyquinoline, 5-nitroquinoline, 5-nitro-2-aminophenol, 4-nitro-2-aminophenol and salts thereof, 2,3-dihydroxynaphthalene-6-sulfonic acid, 1-amino-2-naphthalene-4-sulfonic acid, 1-nitriso-2-hydroxynaphthalene-3,6-disulfonic acid, 1,2-naphthoquinone-4-sulfonic acid and salts thereof, Alizarine, Alizarine Red S, Alizarine Blue S, Alizarine Saphirol SE, Monozol Fuchsine RS, Alizarine Bordeaux, anthraquinone-α-sulfonic acid, anthraquinone-β-sulfonic acid, anthraquinone-1,5-disulfonic acid, anthraquinone-1,8-disulfonic acid, anthraquinone-2,6-disulfonic acid, anthraquinone-2,7-disulfonic acid and salts thereof, Eriochrom Black T and Eriochrom Black A.

15. The process of claim 12, wherein said metal chelating agent is present in said developing solution in an amount of at least 0.001 mole/l.

16. The process of claim 15, wherein said metal chelating agent is present in said developing solution in an amount of at least 0.005 mole/l.

17. The process of claim 12, wherein said developing solution consists essentially of an aqueous alkaline solution.

18. The process of claim 12, wherein said developing solution consists essentially of an aqueous acidic solution.

19. The process of claim 12, wherein said developing solution consists essentially of an aqueous oxidizing agent solution.

20. The process of claim 17, wherein said metallic thin layer contains aluminum.

21. The process of claim 17, wherein said developing solution contains an organic solvent.

22. The process of claim 21, wherein said organic solvent is selected from the group consisting of alcohols, monoethers obtained from alcohols having 1–5 carbon atoms and ethylene glycols.

23. The process of claim 13, wherein said metal chelating agent is selected from the group consisting of anthraquinone-2,6-sodium disulfonate, sodium 4-nitro-2-aminophenolate, sodium ethylenediaminetetraacetate, anthraquinone-2,7-sodium disulfonate and anthraquinone-2,6-disulfonic acid.

* * * * *